United States Patent
Smith

(10) Patent No.: US 7,315,602 B2
(45) Date of Patent: Jan. 1, 2008

(54) DIGITAL SPREAD SPECTRUM FREQUENCY SYNTHESIZER

(75) Inventor: Sterling Smith, Hsinchu (TW)

(73) Assignee: MStar Semiconductor, Inc. (TW)

( * ) Notice: Subject to any disclaimer, the term of this patent is extended or adjusted under 35 U.S.C. 154(b) by 726 days.

(21) Appl. No.: 10/615,845

(22) Filed: Jul. 10, 2003

(65) Prior Publication Data
US 2004/0032898 A1 Feb. 19, 2004

Related U.S. Application Data

(60) Provisional application No. 60/395,338, filed on Jul. 12, 2002.

(51) Int. Cl.
*H03D 3/24* (2006.01)
*H04B 14/06* (2006.01)
*H03L 25/00* (2006.01)
*H03B 21/00* (2006.01)

(52) U.S. Cl. ............... 375/376; 375/245; 375/371; 375/375; 327/105

(58) Field of Classification Search ............... 375/147, 375/143, 373, 376, 326, 327, 328, 371, 240, 375/245, 247, 375–76, 130; 341/143, 76; 327/117, 105–107, 145, 146, 155, 156; 370/105; 331/1; 332/127
See application file for complete search history.

(56) References Cited

U.S. PATENT DOCUMENTS

| | | | | |
|---|---|---|---|---|
| 4,965,531 A | * | 10/1990 | Riley | 331/1 A |
| 5,825,253 A | * | 10/1998 | Mathe et al. | 331/18 |
| 6,236,703 B1 | * | 5/2001 | Riley | 377/48 |
| 6,515,553 B1 | * | 2/2003 | Filiol et al. | 332/127 |
| 6,559,698 B1 | * | 5/2003 | Miyabe | 327/157 |
| 6,717,998 B2 | * | 4/2004 | Adachi et al. | 375/376 |
| 6,876,710 B1 | * | 4/2005 | Pitzer et al. | 375/371 |
| 6,961,400 B1 | * | 11/2005 | Huff et al. | 375/376 |

* cited by examiner

*Primary Examiner*—Mohammed Ghayour
*Assistant Examiner*—Sophia Vlahos
(74) *Attorney, Agent, or Firm*—Michael Bednarek; Paul, Hastings, Janofsky & Walker LLP

(57) ABSTRACT

The present invention provides a digital spread spectrum frequency synthesizer that comprises a noise-shaped quantizer, a divider and an adjustment means. The noise-shaped quantizer is used to quantize a period control word to a time-varying value. The divider is used for generating an output signal by means of dividing a reference signal by the time-varying value, the output signal feeding back to the noise-shaped quantizer so that the noise-shaped quantizer generates the time-varying value in response to the feedback output signal. The adjustment means is used to adjust the period control word by a period offset in response to the output clock. Accordingly, the frequency synthesizer of the present invention can provide a very precise frequency synthesizer featuring a precision spread spectrum clock and jitter stability as well.

13 Claims, 2 Drawing Sheets

DIGITAL SPREAD SPECTRUM FREQUENCY SYNTHESIZER

CROSS-REFERENCE TO RELATED APPLICATION

The present application claims the priority benefits of U.S. provisional application entitled "DIGITAL SPREAD SPECTRUM FREQUENCY SYNTHESIZER" filed on Jul. 12, 2002 Ser. No. 60/395,338. All disclosures of this application are incorporated herein by reference.

BACKGROUND OF THE INVENTION

1. Field of the Invention

The present invention generally relates to a frequency synthesizer. More particular, the present invention relates to a digital spread spectrum frequency synthesizer featuring a precision spread spectrum clock.

2. Description of Related Arts

Modern display system are placing ever increasing demands on the resolution, bandwidth, and switching speed of frequency synthesizers. In the past, these requirements have been satisfied by the conventional phase-locked loop (PLL) synthesizer. The fundamental advantage of PLL's has been their ability to synthesize an output sine wave of high spectral purity that may be tuned over a wide bandwidth. However, the switching speed and resolution of synthesizers are becoming critically important, the conventional PLL's are ill-suited to these applications because they suffer from an inherent inability to simultaneously provide fast frequency switching and high resolution without substantial design complexity.

SUMMARY OF THE INVENTION

It is therefore an objective of the present invention to provide a digital spread spectrum frequency synthesizer featuring a precision spread spectrum clock.

It is another objective of the present invention to provide a digital spread spectrum frequency synthesizer featuring jitter stability.

To attain this object, the present invention provides a digital spread spectrum frequency synthesizer that comprises a divider, a noise-shaped quantizer, an adjustment means and a filter. The divider is used to receive a reference clock with a substantially fixed period and generating an output clock with a time-varying period. The noise-shaped quantizer is used to quantize a period control word to a time-varying value in response to the output clock fed from the divider so that the divider generates the output clock by means of dividing the reference clock by the time-varying value. The adjustment means is used to adjust the period control word by a period offset in response to the output clock. The filter is used to substantially filter out jitter from the output clock.

Moreover, the present invention provides a digital spread spectrum frequency synthesizer that comprises a noise-shaped quantizer, a divider and an adjustment means. The noise-shaped quantizer is used to quantize a period control word to a time-varying value. The divider is used for generating an output signal by means of dividing a reference signal by the time-varying value, the output signal feeding back to the noise-shaped quantizer so that the noise-shaped quantizer generates the time-varying value in response to the feedback output signal. The adjustment means is used to adjust the period control word by a period offset in response to the output signal.

DETAILED DESCRIPTION OF THE PREFERRED EMBODIMENTS

In the following detailed description of the preferred embodiments, reference is made to the accompanying drawings that form a part hereof, and in which is shown by way of illustration specific preferred embodiments in which the invention may be practiced. The preferred embodiments are described in sufficient detail to enable these skilled in the art to practice the invention, and it is to be understood that other embodiments may be utilized and that logical changes may be made without departing from the spirit and scope of the present invention. The following detailed description is, therefore, not to be taken in a limiting sense, and the scope of the present invention is defined only by the appended claims.

Figure 1:
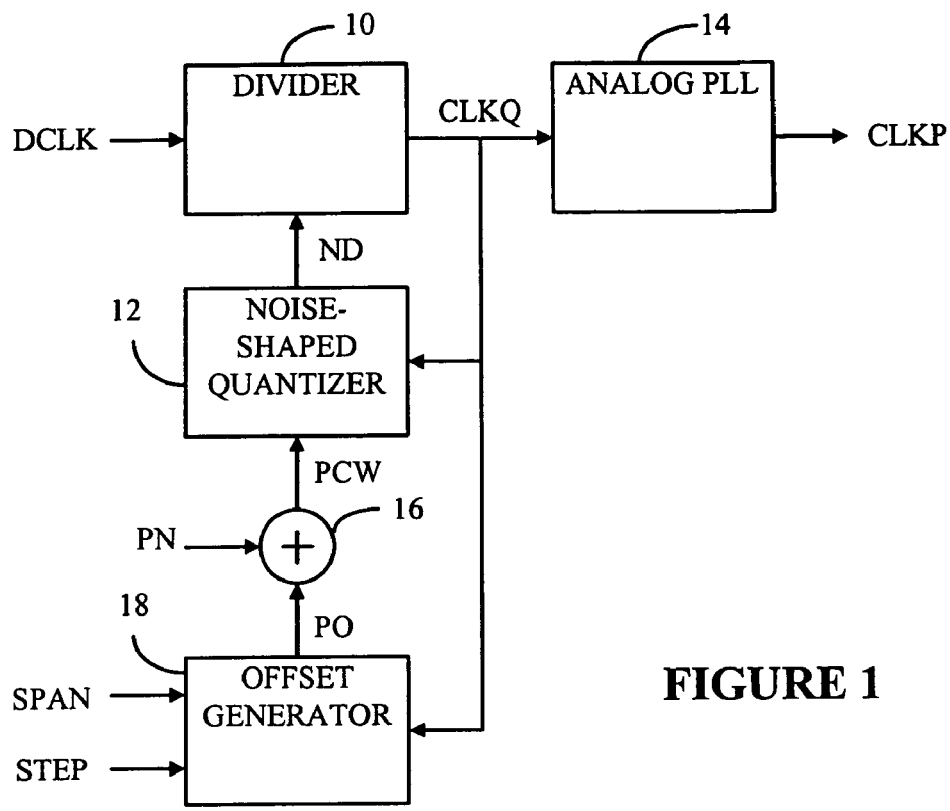
FIG. 1 schematically illustrates a block diagram of a digital spread spectrum frequency synthesizer in accordance with one preferred embodiment of the present invention.

Referring to FIG. 1, a block diagram of a digital spread spectrum frequency synthesizer in accordance with one preferred embodiment of the present invention is schematically illustrated. In FIG. 1, the digital spread spectrum frequency synthesizer of the present invention comprises a divider 10, a noise-shaped quantizer 12, an analog phase locked loop (PLL) 14, an adder 16 and an offset generator 18. A high speed very stable digital clock DCLK, normally based on a crystal oscillator reference, is employed as a stable reference baseline period. The reference clock DCLK provided with a higher frequency will give the preferable results. For example, in the application of flat panel display controllers, 200 MHz or above can be provided for the reference clock DCLK.

The divider 10, the noise-shaped quantizer 12 and the analog phase locked loop (PLL) 14 form a digital frequency synthesizer that has been disclosed in a companion patent application entitled "FREQUENCY SYNTHESIZER". In view of the digital frequency synthesizer per se, the reference clock DCLK is received and divided by a time-varying value ND(t) in the divider 10 so as to generate an output clock CLKQ having a time-varying period TD(t). Although the output clock CLKQ has the time-varying period TD(t), the time-varying algorithm will be arranged to give the output clock CLKQ a very precise average period such that precise average output clock frequency can be obtained. As shown in FIG. 1, the output clock CLKQ is fed back to the noise-shaped quantizer 12 that receives a period control word PCW. The noise-shaped quantizer 12 is employed to quantize the period control word PCW to the time-varying value ND(t) in response to the feedback output clock CLKQ. According to the present invention, the noise-shaped quantizer 12 can be a delta-sigma quantizer so that the time-varying value ND(t) is spectrally shaped by the noise-shaped quantizer 12 using a digital delta-sigma algorithm. Preferably, the period control word PCW is configured with a bit resolution greater than that of the time-varying value ND(t). In this preferred embodiment, the period control word is a precise word of 24-bit resolution which is quantized into a low precision value ND(t) of 5-bit resolution.

As mentioned above, the noise-shaped quantizer 12 of the present invention converts the high resolution input, that is, the period control word PCW, to the low resolution output ND(t) in such a way as to spectrally shape the quantization error, most of which is at very high frequency range. Noted that the quantization error is directed to the difference between the period control word and time-varying integer value ND(t). With delta-sigma quantization, the spectral density of the quantization error in ND(t) or TD(t) is very low at low frequencies and rises with increasing frequency. In some systems no further processing need be done to the output clock CLKQ if cycle-cycle jitter is not critical. In other systems, the output clock CLKQ may not be useful as a low jitter output clock due to the large amount of jitter from the time-varying nature of the period TD(t). To reduce the jitter, the output clock CLKQ may be input to the analog PLL 14 that can filter the jitter to produce a stable output clock CLKP. If the spectral properties of the time-varying period TD(t) are properly designed, the amount of jitter reduction from the analog PLL 14 can be very significant. In other words, the output clock CLKQ can be filtered by using the analog PLL 14 to suppress the high frequency jitter if the cycle-cycle jitter is a design concern. Thus, the analog PLL 14 serves as a filter means for effectively filtering the jitter from the output clock CLKQ.

Moreover, the divider 10 can take any value between minimum and maximum given by the noise-shaped quantizer 12. Thus, using the time-varying divider 10 to divide down the high frequency fixed-period clock reference clock DCLK to synthesize a precise long-term average frequency output clock CLKQ directly in digital domain. Therefore, the average period of the output clock CLKQ or the filtered output clock CLKP is kept very precise.

According to the present invention, the synthesized output clock CLKP is so generated to provide a spread spectrum clock. The spread spectrum clock is characterized by three parameters: FN is a frequency nominal associate with a period nominal PN; SPAN is a clock number associated with a maximum spread of the clock spectrum; STEP is a period offset per clock cycle. As shown in FIG. 1, the output clock CLKQ generated by divider 10 is applied to the offset generator 18. The offset generator 18 is utilized to generate a period offset PO for adjusting the period control word PCW for each output clock period. In this embodiment, the period offset PO is adjusted by a constant value STEP for each clock period of the output clock CLKQ. The period offset PO is adjusted by a positive value +STEP for increasing clock period of the output clock CLKQ, and the period offset is adjusted by a negative value −STEP for decreasing clock period of the output clock CLKQ. Thus, the period offset PO is added up with the period nominal PN at the adder 16 to adjust the period control word PCW either increasingly or decreasingly. As such, the frequency of the output clock CLKQ can be either decreased or increased with reference to the frequency nominal FN. The maximum spread of the clock spectrum is defined by the counted value SPAN to be described in the following.

Figure 2:
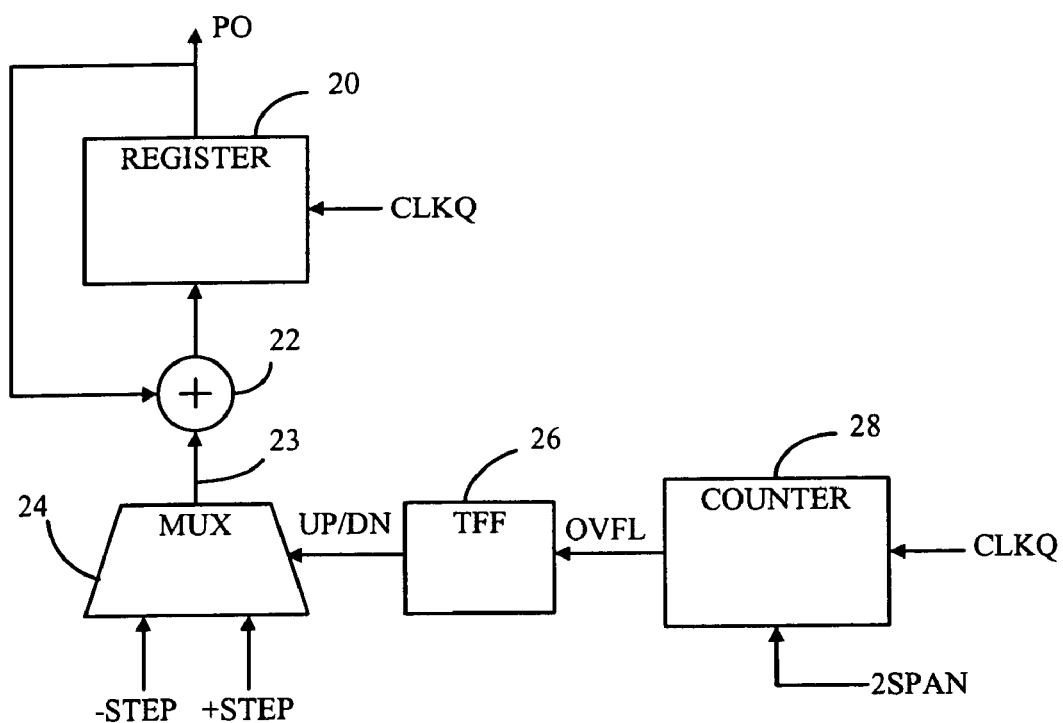
FIG. 2 depicts a detailed circuit diagram of the offset generator of FIG. 1 as an example.

Referring to FIG. 2, a detailed circuit diagram of the offset generator 18 of FIG. 1 is depicted as an example. However, such a detailed example is not to be taken in a limiting sense, and it is to be understood that other embodiments may be utilized and that logical changes may be made without departing from the spirit and scope of the present invention.

In FIG. 2, the offset generator 18 is implemented by means of an up/down counter. The up/down counter 18 comprises a register 20, an adder 22, a multiplexer 24, a toggle flip-flop 26 and a counter 28. The output clock CLKQ is applied to the register 20 and the counter 28 for the purpose of timing control. The counter 28 is used to count the clock number of the output clock CLKQ and check a counted value. If the counted value reaches 2SPAN, an overflow signal OVFL is asserted by the counter 28 and transmitted to the toggle flip-flop 26. The flip-flop 26 changes from a down-count signal DN to an up-count signal UP or changes from an up-count signal UP to a down-count signal DN in response to the asserted overflow signal OVFL. The multiplexer 24 is used to provide the positive value +STEP to the adder 22 via a signal line 23 in response to the up-count signal UP, or provide the negative value −STEP to the adder 22 via the signal line 23 in response to the down-count signal DN. The adder 22 is used to add +STEP or −STEP up to a value previously stored in the register 20 and then store an adjusted value to the register 20 for next period. Accordingly, the register 20 can provide the adjusted value as the period offset PO for next period adjustment.

Figure 3:
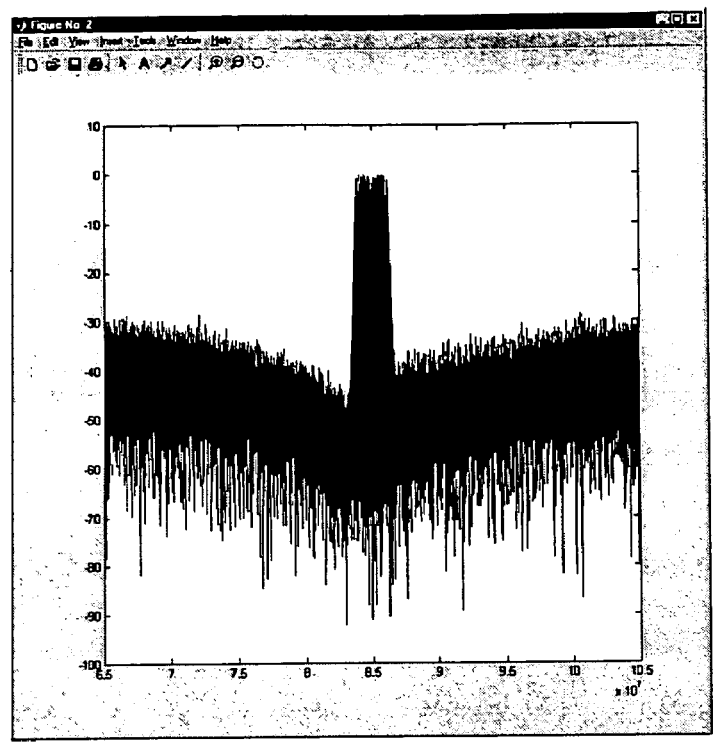
FIG. 3 depicts a power spectral plot diagram of the output clock CLKQ.
Figure 4:
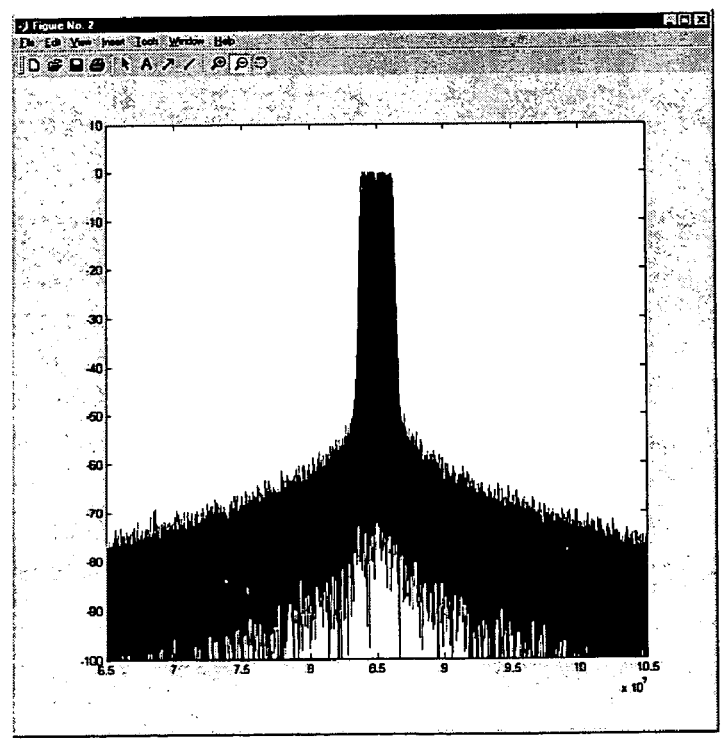
FIG. 4 depicts a power spectral plot diagram of the output clock CLKP.

FIGS. 3 and 4 depict power spectral plot diagrams of CLKQ and CLKP, respectively, where y-axis is dBc and x-axis is frequency. These simulation FIGS. 3 and 4 are plotted upon DCLK=214 MHz, FN=85 MHz, SPAN=1342, STEP=30. By comparing FIGS. 3 and 4, the use of the analog PLL 14 as the jitter low pass filter to filter out the high frequency jitter from the output clock CLKQ. Thus, the low-jitter output clock CLKP can be produced such that aliasing effect can be suppressed effectively.

According to the present invention, the next period control word PCW is adjusted by a predetermined value STEP for each output clock period. For increasing period a positive value +STEP is added. For decreasing period a negative value −STEP is added. This simple algorithm gives an optimal spread (flat bandpass) of the output clock spectrum. A constant digital increment/decrement can be utilized due to the linear relationship between the output period and the digital period control word PCW in the frequency synthesizer.

Moreover, the noise shaped algorithm is used to convert the precise period control word of 16-40 bits, preferably, to a dynamically changing low resolution divider value of 5-bits in this embodiment. Each output clock period the noise shaped quantizer 12 will generate a new divider value for the next output clock period. The noise shaped quantization algorithm causes the jitter created by the dynamically changing divider value to be present mainly at high frequency. This high frequency jitter is filtered out if necessary by the following analog PLL 14, leaving only the desired spectral spread.

Although the description above contains much specificity, it should not be construed as limiting the scope of the invention but as merely providing illustrations of some of the presently preferred embodiments of the present invention. Thus, the scope of the present invention should be determined by the appended claims and their equivalents, rather than by the examples given.

What is claimed is:

1. A digital spread spectrum frequency synthesizer, comprising:

a divider for receiving a reference clock with a substantially fixed period and generating an output clock with a time-varying period;

a noise-shaped quantizer for quantizing a period control word to a time-varying value in response to said output clock fed from said divider so that said divider generates said output clock by means of dividing said reference clock by said time-varying value;

means for adjusting said period control word in response to said output clock, wherein said period control word is within a period range with reference to a period nominal;

wherein said means for adjusting said period control comprises: an offset generator for generating a period offset in response to said output clock and an adder for generating a period offset in response to said output clock; and an adder for generating said adjusted period control word by means of adding said period offset to said period nominal; and a filter for substantially filtering out jitter from said output clock.

2. The digital spread spectrum frequency synthesizer as claimed in claim 1, wherein said period control word has a bit resolution greater than that of said time-varying value.

3. The digital spread spectrum frequency synthesizer as claimed in claim 1, wherein said noise-shaped quantizer is a delta-sigma quantizer.

4. The digital spread spectrum frequency synthesizer as claimed in claim 1, wherein said filter is an analog phase locked loop (PLL) device as a low pass filter for removing high frequency jitter from said output clock.

5. A digital spread spectrum frequency synthesizer, comprising:
a divider for receiving a reference clock with a substantially fixed period and generating an output clock with a time-varying period;
a noise-shaped quantizer for quantizing a period control word to a time-varying value in response to said output clock fed from said divider so that said divider generates said output clock by means of dividing said reference clock by said time-varying value;
means for adjusting said period control word by a period offset in response to said output clock; and
a filter for substantially filtering out jitter from said output clock, wherein said means for adjusting said period control word comprises:
an offset generator for generating said period offset in response to said output clock; and
an adder for generating said adjusted period control word by means of adding said period offset to a period nominal,
wherein said offset generator is an up/down counter.

6. A digital spread spectrum frequency synthesizer, comprising:
a noise-shaped quantizer for quantizing a period control word to a time-varying value;
a divider for generating an output signal by means of dividing a reference signal by said time-varying value, said output signal feeding back to said noise-shaped quantizer so that said noise-shaped quantizer generates said time-varying value in response to said feedback output signal; and
means for adjusting said period control word in response to said output signal, wherein the period control word is within a period range with reference to a period nominal wherein said means for adjusting said period control comprises: an offset generator for generating a period offset in response to said output clock and an adder for generating a period offset in response to said output clock; and an adder for generating said adjusted period control word by means of adding said period offset to said period nominal.

7. The digital spread spectrum frequency synthesizer as claimed in claim 6, further comprising a filter for significantly filtering out jitter from said output signal.

8. The digital spread spectrum frequency synthesizer as claimed in claim 6, wherein said filter is an analog phase locked loop (PLL) device as a low pass filter for removing high frequency jitter from said output signal.

9. The digital spread spectrum frequency synthesizer as claimed in claim 6, wherein said reference signal is a reference clock with a substantially fixed period.

10. The digital spread spectrum frequency synthesizer as claimed in claim 6, wherein said output signal is an output clock with a time-varying period and a substantially precise long-term average frequency.

11. The digital spread spectrum frequency synthesizer as claimed in claim 6, wherein said period control word has a bit resolution greater than that of said time-varying value.

12. The digital spread spectrum frequency synthesizer as claimed in claim 6, wherein said noise-shaped quantizer is a delta-sigma quantizer.

13. A digital spread spectrum frequency synthesizer, comprising:
a noise-shaped quantizer for quantizing a period control word to a time-varying value;
a divider for generating an output signal by means of dividing a reference signal by said time-varying value, said output signal feeding back to said noise-shaped quantizer so that said noise-shaped quantizer generates said time-varying value in response to said feedback output signal; and
means for adjusting said period control word by a period offset in response to said output signal,
wherein said means for adjusting said period control word comprises:
an offset generator for generating said period offset in response to said output clock; and
an adder for generating said adjusted period control word by means of adding said period offset to a period nominal,
wherein said offset generator is an up/down counter.

* * * * *